United States Patent [19]

Krumme et al.

[11] Patent Number: 4,946,241

[45] Date of Patent: Aug. 7, 1990

[54] METHOD OF MANUFACTURING IRON GARNET LAYERS

[75] Inventors: Jens-Peter Krumme, Hamburg, Fed. Rep. of Germany; John Petruzello, Briarcliff Manor, N.Y.; Wolfgang Radtke, Scharbeutz, Fed. Rep. of Germany

[73] Assignee: U.S. Philips Corporation, New York, N.Y.

[21] Appl. No.: 385,137

[22] Filed: Jul. 25, 1989

[30] Foreign Application Priority Data

Jul. 29, 1988 [DE] Fed. Rep. of Germany ....... 3825787

[51] Int. Cl.$^5$ .......................... G02B 5/14; C23C 14/34
[52] U.S. Cl. ............................ 350/96.12; 204/192.15; 204/192.2; 204/192.26
[58] Field of Search ........... 204/192.15, 192.2, 192.18, 204/192.26; 350/96.11, 96.12, 96.14

[56] References Cited

U.S. PATENT DOCUMENTS 4,608,142 8/1986 Gomi et al. .................. 204/192.2
4,832,980 5/1989 Ichihara et al. ............. 204/192.2 X

*Primary Examiner*—Nam X. Nguyen
*Attorney, Agent, or Firm*—Norman N. Spain

[57] ABSTRACT

A method of manufacturing iron garnet layers on a substrate, in a layer sequence of different order by means of RF-cathode sputtering in an inert gas plasma, using a target comprising predominantly an iron garnet phase in addition to residual phases having a substantially equal sputtering rate, the ions of said inert gas plasma bombarding the growing layer having an ion energy of less than $10^2$ eV and a pressure in the range from 0.1 to 2.0 Pa, in which method RF-power is fed into the target electrode (cathode) at a RF-voltage of approximately 200 $V_{rms}$, thereby first depositing an amorphous to X-ray amorphous iron garnet layer as an intermediate layer at a substrate temperature below 460° C. and, subsequently, a polycrystalline iron garnet layer at a substrate temperature exceeding 520° C., while simultaneously applying a RF-voltage of approximately 50 $V_{rms}$ to the substrate electrode, which voltage is linearly reduced during the deposition of the first 5-10 nm of the layer to a floating potential relative to earth.

19 Claims, No Drawings

METHOD OF MANUFACTURING IRON GARNET LAYERS

BACKGROUND OF THE INVENTION

The instant invention relates to a method of manufacturing iron garnet layers on a substrate, in a layer sequence of different order by means of RF-cathode sputtering in an inert gas plasma, making use of a target which comprises predominantly an iron garnet phase in addition to residual phases having an almost equal sputtering rate, the ions of said inert gas plasma bombarding the growing layer having an ion energy of less than $10^2$ eV and a pressure in the range from 0.1 to 2.0 Pa.

Such a method is known from German Patent Application P 37 04 378.1. Layers which are manufactured according to this known method are used to form optical waveguides for non-reciprocal optical components. In the case of reversible magnetooptical data storage in iron garnet layers or orthoferrite layers or hexaferrite layers, morphologically "smooth" layers are very advantageous to attain a low noise level in the read signal or in the case of optical waveguides to keep the scattering losses at a low level.

For example, when polycrystalline iron garnet layers are deposited on substrates of a different order, layers having a certain surface roughness are obtained, i.e., which are not morphologically "smooth". For example, if iron garnet is deposited on glass substrates in a polycrystalline form by means of RF-cathode sputtering in an argon plasma at a pressure of 0.6 Pa and temperatures exceeding 520° C., a sequence of coarse, fine and, finally, columnar crystallites having a static crystal orientation is obtained, which leads to layers having a relatively large surface roughness. The serrated magnetic domain structure with a high coercive field strength and relatively high light-scattering losses, which are the concomitants of this morphology, denote a distinct grain structure.

It is an object of the invention to provide a method by means of which polycrystalline iron garnet layers can be manufactured, the morphology of which approaches that of monocrystalline iron garnet layers, and which iron garnet layers have a distinct texture.

SUMMARY OF THE INVENTION

According to the invention, this object is achieved in by a method in which RF-power is applied to the target electrode (cathode) at a RF-voltage of approximately 200 $V_{rms}$, thereby first depositing an amorphous to X-ray amorphous iron garnet layer as an intermediate layer at a substrate temperature below 460° C. and, subsequently, a polycrystalline iron garnet layer at a substrate temperature exceeding 520° C., while simultaneously applying a RF-voltage of approximately 50 $V_{rms}$ to the substrate electrode, which voltage is linearly reduced during the deposition of the first 5 to 10 nm of the layer to a floating potential relative to earth.

The invention is based on the recognition that the inhomogeneous crystallite structure, which is brought about by crystallite nucleation at the interface between substrate and growing layer and by the further crystal growth in the growing layer, can be influenced by particle bombardment using low-energy ions. This enables the number of crystallite nuclei per surface area to be increased and their crystallographic orientation at the interface with the substrate to be unified.

The RF-potential drop across the substrate electrode can be obtained by either connecting the substrate electrode to earth via a variable RF-impedance or by feeding RF-power from the RF-source into the substrate electrode at the same time as RF-power is fed into the target electrode. In this manner, an RF-potential is developed at the substrate, which is adjustable between approximately 50 V and a floating value, which leads to an ion bombardment of the growing layer at adjustable energy levels below 100 eV.

DETAILED DESCRIPTION OF THE INVENTION

In accordance with advantageous embodiments of the method according to the invention, iron garnet layers are manufactured having a composition which corresponds to the general formula (A,B)$_3$(A,B)$_5$O$_{12}$, wherein A = at least one rare earth metal, Bi, Pb and/or Ca, and B = Ga, Al, Fe, Co, Ni, Mn, Ru, Ir, In and/or Sc.

For example, a polycrystalline iron garnet layer having the following composition was manufactured: $Gd_{2,11}B_{1,01}Fe_{4,06}Ga_{0,82}O_{12}$. An amorphous iron garnet layer of, for example, the following composition was manufactured: $Gd_{2,18}B_{0,36}Fe_{4,31}Ga_{1,15}O_{12}$.

In accordance with further advantageous embodiments of the method according to the invention, substrates having a monocrystalline form, for example of semiconductor material such as, for example, III-V compounds or silicon are used, or substrates having a non-monocrystalline form, for example, of glass and more particularly quartz glass or of thermally oxidized silicon are used.

When amorphous and/or polycrystalline iron garnet layers are deposited on, for example, monocrystalline substrates of a semiconductor material such as, for example, III-V compounds such as gallium arsenide or indium phosphide, it is possible, for example, to manufacture garnet-based integrated optoelectronic components having gyrotropic properties. In this connection, a possible combination may consist of laser diodes and optical isolators.

The present method has the advantage that on almost any substrates a morphology of polycrystalline iron garnet layers can be obtained which approaches the morphology of monocrystalline iron garnet layers.

According to a further advantageous embodiment of the inventive method, a magnetron is used as the target electrode to which the RF-power necessary for the sputtering process is applied. The use of a magnetron results in a concentration of the plasma near the target, and consequently in a substantial reduction of the ion bombardment of the growing layer, so that, for example, backsputtering effects which adversely affect the growth of the crystalline layer are minimized. When a magnetron electrode is used, a maximum concentration of the plasma near the target can be obtained by selecting a phase composition for the target to be sputtered which exhibits the smallest possible saturation magnetization. The use of a magnetron has the additional advantage that in comparison with methods which employ RF-cathode sputtering devices in a diode arrangement, the distance between target and substrate can be optimized, i.e., the lowest possible plasma density and smallest possible amount of kinetic energy in the vicinity of the substrate in combination with the highest possible deposition rate.

RF-cathode sputtering can be carried out by means of commercially available RF voltage-operated cathode sputtering devices having a target cathode (magnetron) which is provided with a magnetic system, a device for measuring the effective RF-voltage both at the target electrode and the substrate electrode having to be provided.

The magnetron cathode is fitted in a horizontal position in an ordinary vacuum recipient. The stabilization of the RF-voltage at the target electrode at values smaller than ±1% is obtained via a computer control. The pressure and the composition of the process gas are also kept constant at values smaller than ±1% by a computer control. An ordinary RF-generator is used as the energy source for the sputtering arrangement, which generator is operated at an output power of 200 W. The operating frequency is 13.56 MHz.

The RF-voltage of approximately 50 $V_{rms}$ which is to be adjusted at the substrate electrode prior to the deposition of the polycrystalline iron garnet layer, is applied by the RF-generator either simultaneously with the RF-voltage at the target electrode via an impedance-matching member or by connecting the substrate electrode to earth via the above impedance-matching member. During the deposition of the first 5 to 10 nm of the layer, the RF-voltage applied to the substrate electrode is reduced to a floating potential relative to earth by readjusting the impedance-matching member. In this manner, the energy of the inert-gas ions impinging on the growing layer is reduced to such an extent that backsputtering effects of the growing layer become negligibly small and that further layer growth can be completed in an undisturbed manner.

The invention will be explained in greater detail by means of an exemplary embodiment.

Bodies of iron garnet-mixed oxides, which are manufactured by hot-pressing or sintering are used as targets (cathodic sputtering source), said bodies having a diameter of 75 mm, a thickness of 4 mm and a porosity below 10%, and, preferably, a magnetic saturation polarization $I_S < 3$ mT.

(111)-oriented calcium-magnesium-zirconium-substituted gadolinium-gallium-garnet-single crystal discs of the general formula $(Gd, Ca)_3(Ga, Mg, Zr)_5O_{12}$ having a diameter of 30 mm are used as substrates which are purified and pre-etched in known manner prior to the deposition process.

In order to manufacture targets, powder mixtures composed of $BiFeO_3$, $BiGd_2Fe_5O_{12}$, $Al_2O_3$ and $Ga_2O_3$ are sintered in an oxygen atmosphere at a pressure of 100 Pa for 6 hours at a temperature below 920° C., the process being conducted such that there is hardly any residual free $Bi_2O_3$ in the ceramic texture. Free $Bi_2O_3$ must not be present in the target because its higher sputtering rate in comparison with the other target constituents leads to mechanical disintegration of the target surface; the use of mixed oxides leads to a homogenization of the sputtering rate of all phase constituents of the target.

For the manufacture of an approximately 2 μm thick polycrystalline iron garnet layer having the composition $Gd_{2.11}Bi_{1.01}Fe_{4.06}Ga_{0.82}O_{12}$ and an approximately 5 nm thick amorphous or X-ray amorphous iron garnet layer of the composition $Gd_{2.18}Bi_{0.36}Fe_{4.31}Ga_{1.15}O_{12}$ a target of the following composition was used (quantities in % by weight):

| | |
|---|---|
| $Gd_2O_3$ | 34.44 |
| $Bi_2O_3$ | 28.52 |
| $Fe_2O_3$ | 30.91 |
| $Ga_2O_3$ | 6.13. |

The target body is secured to the target electrode by means of a properly heat-conducting adhesive (for example, epoxide resin filled with silver powder).

In order to conduct away dissipated heat, for example, water-cooled target electrodes are efficaciously used.

The deposition process is conducted in such a manner that the sputtering equipment is first evacuated to a pressure below $10^{-3}$ Pa by means of a vacuum pump, after which an inert gas, preferably argon, having a pressure of 0.6 Pa is introduced.

The distance between the substrate and the target is 80 mm. The deposition rate is approximately 1.0 μm/h.

For the deposition of the approximately 5 mm thick X-ray amorphous iron-garnet intermediate layer, the substrate temperature is set at approximately 460° C. The RF-voltage measured at the RF-supply lead on the target electrode is 200 $V_{rms}$. For the deposition of the polycrystalline iron garnet layer on the X-ray amorphous iron garnet layer (intermediate layer), the substrate is first heated to a temperature exceeding 520° C. Subsequently, a RF-voltage of 50 $V_{rms}$ is adjusted at the substrate electrode via a variable RF-impedance in the supply lead, which voltage is linearly reduced to 0 within the first 30 s of the deposition of the polycrystalline iron garnet layer to be deposited subsequently on the X-ray amorphous iron garnet layer; after reducing the RF-voltage to 0, a floating potential adjusts itself at the substrate electrode and, moreover, the substrate electrode is separated from the RF-supply lead and the impedance network.

By means of this method polycrystalline iron garnet layers having a relatively smooth surface are obtained, and according to investigations by means of a transmission electron microscope the layers exhibit a uniform morphology which approaches that of monocrystalline iron garnet layers. The polycrystalline iron garnet layers manufactured by means of the present method exhibit a relatively smooth magnetic domain structure, and a clearly reduced coercive field strength in comparison with polycrystalline layers manufactured without applying a variable RF-voltage to the substrate electrode. The polycrystalline iron garnet layers manufactured by means of the present method exhibit a distinct (111) texture.

It should be pointed out that the microstructure of the substrate used for the deposition of a sequence of an amorphous (or X-ray amorphous) iron garnet layer and a polycrystalline iron garnet layer, i.e., for example, a (111) oriented non-magnetic garnet single crystal disc, does not influence the morphology of the polycrystalline layers manufactured, because the polycrystalline iron garnet layer is deposited on the X-ray amorphous or amorphous iron garnet layer which is first deposited on the substrate. Besides, the surface energy which is important for the nucleation of the polycrystalline layer is determined by the interface with the amorphous (or X-ray amorphous) iron garnet layer. Consequently, the present method enables almost any substrate to be coated with a polycrystalline iron garnet layer having a relatively low surface roughness, provided that an X-ray amorphous iron garnet intermediate layer is present. Apart from the type of component to be manufactured, essentially only the chemical and thermal resistance and the coefficient of thermal expansion of the substrate material play a part in the selection of the substrates.

We claim:

1. A method of manufacturing iron garnet layers on a substrate, in a layer sequence of different order by means of RF-cathode sputtering in an inert gas plasma, making use of a target electrode which comprises predominantly an iron garnet phase in addition to residual phases having an almost equal sputtering rate, the ions of said inert gas plasma bombarding the growing layer having an ion energy of less than $10^2$ eV, and a pressure in the range from 0.1 to 2.0 Pa, wherein RF-power is first applied to the target electrode at a RF-voltage of approximately 200 $V_{rms}$, thereby first depositing an amorphous iron garnet layer as an intermediate layer at a substrate temperature below 460° C. and, subsequently depositing a polycrystalline iron garnet layer at a substrate temperature exceeding 520° C., while simultaneously applying a RF-voltage of approximately 50 $V_{rms}$ to the substrate electrode, which voltage is linearly reduced during the deposition of the first 5–10 nm of the polycrystalline iron garnet layer to a floating potential relative to earth.

2. A method as claimed in claim 1, wherein the amorphous intermediate layer is deposited in a thickness of up to 5 nm.

3. A method as claimed in claim 1, characterized in that argon is used as the inert gas.

4. A method as claimed in claim 1, wherein the pressure of the inert gas atmosphere is adjusted at a value in the range from 0.3 to 1.0 Pa.

5. A method as claimed in claim 4, wherein the pressure is adjusted at a value of 0.6 Pa.

6. A method as claimed in claim 1, wherein the iron garnet layers have a composition in accordance with the general formula $(A, B)_3(A, B)_5O_{12}$, wherein
   A = at least one element selected from the group consisting of rare earth metals, Bi, Pb and/or Ca, and
   B = at least one element selected from the group consisting of Ga, Al, Fe, Co, Ni, Mn, Ru, Ir, In and/or Sc.

7. A method as claimed in claim 6, wherein the polycrystalline iron garnet layer has a composition in accordance with the formula $Gd_{2,11}Bi_{1,01}Fe_{4,06}Ga_{0,82}O_{12}$.

8. A method as claimed in claim 6, wherein the amorphous iron garnet layer has a composition in accordance with the formula $Gd_{2,18}Bi_{0,36}Fe_{4,31}Ga_{1,15}O_{12}$.

9. A method as claimed in claim 1, wherein a monocrystalline substrate is used.

10. A method as claimed in claim 9, wherein a monocrystalline disc of a semiconductor material is used as the substrate.

11. A method as claimed in claim 10, wherein a III-V-compound is used as the substrate.

12. A method as claimed in claim 11, wherein a substrate of gallium arsenide is used.

13. A method as claimed in claim 11, wherein a substrate of indium phosphide is used.

14. A method as claimed in claim 10, wherein a substrate of silicon is used.

15. A method as claimed in claim 1, wherein a non-monocrystalline substrate is used.

16. A method as claimed in claim 15, wherein a glass substrate is used.

17. A method as claimed in claim 1, wherein a magnetron is used as the target electrode, into which the RF-power required for the sputtering process is fed.

18. An optical waveguide comprising layers being manufactured in accordance with the method as claimed in claim 1.

19. An integrated optoelectronic component, comprising layers manufactured in accordance with the method as claimed in claim 1.

* * * * *